US010316219B2

(12) United States Patent
Ahn et al.

(10) Patent No.: US 10,316,219 B2
(45) Date of Patent: Jun. 11, 2019

(54) THERMALLY RELEASABLE ADHESIVE MEMBER AND DISPLAY APPARATUS INCLUDING THE SAME

(71) Applicants: Samsung Display Co., Ltd., Yongin-si (KR); Myongji University Industry and Academia Cooperation Foundation, Yongin-si (KR)

(72) Inventors: Byungwook Ahn, Seoul (KR); Kikyung Youk, Bucheon-si (KR); Sukwon Jung, Cheonan-si (KR); Jeongho Hwang, Cheonan-si (KR); Jongdeok Park, Seoul (KR); Seungchan Lee, Hwaseong-si (KR); Intae Son, Yongin-si (KR); Junhyup Lee, Seongnam-si (KR)

(73) Assignees: Samsung Display Co., Ltd., Yongin-si (KR); Myongji University Industry and Academia Cooperation Foundation, Yongin-si (KR)

( * ) Notice: Subject to any disclaimer, the term of this patent is extended or adjusted under 35 U.S.C. 154(b) by 27 days.

(21) Appl. No.: 15/647,259

(22) Filed: Jul. 12, 2017

(65) Prior Publication Data
US 2018/0155576 A1 Jun. 7, 2018

(30) Foreign Application Priority Data

Dec. 2, 2016 (KR) ........................ 10-2016-0163814

(51) Int. Cl.
*G06F 3/041* (2006.01)
*C09J 5/06* (2006.01)
(Continued)

(52) U.S. Cl.
CPC ........ *C09J 5/06* (2013.01); *B32B 5/16* (2013.01); *B32B 7/12* (2013.01); *B32B 27/06* (2013.01);
(Continued)

(58) Field of Classification Search
CPC ............. C09J 2201/128; C09J 2201/36; C09J 2203/318; C09J 2205/11; B32B 2457/20; G06F 3/041
(Continued)

(56) References Cited

U.S. PATENT DOCUMENTS 6,488,803 B2   12/2002   Kiuchi et al.
7,029,550 B2   4/2006    Kiuchi et al.
(Continued)

FOREIGN PATENT DOCUMENTS

EP   1326936   4/2005
EP   2315500   4/2011
(Continued)

OTHER PUBLICATIONS

The Extended European Search Report dated Mar. 13, 2018, issued in European Patent Application No. 17204849.8.
(Continued)

*Primary Examiner* — Bruce H Hess
(74) *Attorney, Agent, or Firm* — H.C. Park & Associates, PLC

(57) ABSTRACT

A thermally releasable adhesive member including a base resin and microcapsules dispersed and disposed in the base resin. The microcapsule includes a core part, a shell part wrapping the core part, and an organic solvent disposed in the core part, and an average diameter of the microcapsules is in a range from about 50 nm to about 500 nm. The adhesive member may maintain high optical transmittance and may be easily detached at a high temperature.

19 Claims, 6 Drawing Sheets

(51) Int. Cl.
*H05K 5/00* (2006.01)
*H05K 5/03* (2006.01)
*C09J 11/08* (2006.01)
*B32B 7/12* (2006.01)
*B32B 5/16* (2006.01)
*B32B 27/06* (2006.01)
*C09J 11/06* (2006.01)

(52) U.S. Cl.
CPC ................ *C09J 11/06* (2013.01); *C09J 11/08* (2013.01); *H05K 5/0017* (2013.01); *H05K 5/03* (2013.01); *B32B 2307/412* (2013.01); *B32B 2457/20* (2013.01); *C09J 2201/128* (2013.01); *C09J 2201/36* (2013.01); *C09J 2203/318* (2013.01); *C09J 2205/102* (2013.01); *C09J 2205/11* (2013.01); *C09J 2205/302* (2013.01); *C09J 2433/00* (2013.01); *C09J 2479/02* (2013.01); *G06F 3/041* (2013.01)

(58) Field of Classification Search
USPC ...................................................... 428/321.5
See application file for complete search history.

(56) References Cited

U.S. PATENT DOCUMENTS

| | | |
|---|---|---|
| 7,371,300 B2 | 5/2008 | Bain et al. |
| 8,409,884 B2 | 4/2013 | Hirayama et al. |
| 2014/0306187 A1 | 10/2014 | Kim et al. |

FOREIGN PATENT DOCUMENTS

| | | |
|---|---|---|
| JP | 2005029607 | 2/2005 |
| JP | 2007177210 | 7/2007 |
| KR | 10-0473209 | 3/2005 |
| KR | 10-0665421 | 1/2007 |
| KR | 10-0696436 | 3/2007 |
| KR | 10-0886677 | 3/2009 |
| KR | 10-2014-0014824 | 2/2014 |
| KR | 10-2014-0123735 | 10/2014 |

OTHER PUBLICATIONS

Byungsun Lee et al., "A Simple Approach for the Preparation of Fluorescent Poly(methyl methacrylate)—Polyethyleneimine Nanoparticles Containing Biomolecular Curcumin", Journal of Nanoscience and Nonatechnology, 2016, pp. 10874-10880, vol. 16, No. 10, American Scientific Publishers, United States of America.

THERMALLY RELEASABLE ADHESIVE MEMBER AND DISPLAY APPARATUS INCLUDING THE SAME

CROSS-REFERENCE TO RELATED APPLICATION

This application claims priority from and the benefit of Korean Patent Application No. 10-2016-0163814, filed on Dec. 2, 2016, which is hereby incorporated by reference for all purposes as if fully set forth herein.

BACKGROUND

Field

Exemplary embodiments relate to a thermally releasable adhesive member and a display apparatus including the same. More particularly, exemplary embodiments relate to a thermally releasable adhesive member having decreased adhesion strength at a high temperature, and a display apparatus including the same.

Discussion of the Background

Various display apparatuses, which are used in a multimedia apparatus such as a television, a portable phone, a tablet computer, a navigation apparatus, and a game console, are constantly being developed. Display apparatuses may be manufactured by combining a plurality of members from each other. In order to combine a plurality of members from each other, for example, use of an adhesive member is widely used. In particular, in a display apparatus, a method of combining a display panel with other members using an optically clear adhesive (OCA) is used to improve visibility.

However, in the case where a rework is required during the manufacture of a display apparatus, detachment of an adhesive member used for combining members from each other is required. In this case, the adhesive member is required to be easily detached from the members of the display apparatus.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thermally releasable adhesive member in which adhesion strength is deteriorated by supplied heat, and a display apparatus in which re-workability is improved by using the thermally releasable adhesive member.

Additional aspects will be set forth in the detailed description which follows, and, in part, will be apparent from the disclosure, or may be learned by practice of the inventive concept.

An exemplary embodiment discloses a thermally releasable adhesive member including a base resin and microcapsules dispersed and disposed in the base resin. The microcapsule includes a core part, a shell part wrapping the core part, and an organic solvent disposed in the core part. An average diameter of the microcapsules is from about 50 nm to about 500 nm.

A transmittance of the thermally releasable adhesive member in a wavelength range of about 400 nm to about 800 nm may be greater than or equal to 90%.

An absolute value of refractive index difference of the base resin and the microcapsule may be less than or equal to about 0.1.

A haze value of the thermally releasable adhesive member may be less than or equal to 0.1%.

A vaporization temperature of the organic solvent may be from about 90° C. to about 110° C.

The organic solvent may have a solubility with respect to water that is less than or equal to about 1.0 at room temperature.

The organic solvent may include at least one selected from methylcyclohexane, cyclohexane, cyclopentane, isooctane, tert-butyl acetate, heptene or heptanes.

The organic solvent may be leaked out from the microcapsule at a temperature higher than the vaporization temperature thereof.

The thermally releasable adhesive member may have a first adhesion strength at room temperature and a second adhesion strength at the vaporization temperature, and a relation of "second adhesion strength<0.9×(first adhesion strength)" may be satisfied.

The microcapsules may be included in a ratio from about 0.01 wt % to about 20 wt % on the basis of a total weight of the base resin and the microcapsules.

The thermally releasable adhesive member may be a double-sided adhesive sheet including a first side and an opposite second side, and a dispersion density of the microcapsules may decrease from the first side to the second side.

The thermally releasable adhesive member may include a first adhesive part in which the microcapsules are dispersed with a first density, a second adhesive part in which the microcapsules are dispersed with a second density, and a third adhesive part disposed between the first adhesive part and the second adhesive part. The microcapsules in the third adhesive part may be disposed with a third density, and the third density may be less than or equal to the first density or the second density.

The base resin may include at least one of an acryl-based resin, a silicone-based resin, a urethane-based resin, an epoxy-based resin, a rubber-based resin, or a polyester-based resin.

The microcapsule may be an amphiphilic particle in which the core part is hydrophobic and the shell part is hydrophilic.

The core part may include at least one selected from poly(2-ethylhexylacrylate), polybutyl acrylate, polyvinyl acetate, polymethyl methacrylate, polyethyl acrylate, polymethyl acrylate, polybenzyl acrylate, polyphenoxyethyl acrylate, polyacrylic acid, polyhydroxyethyl methacrylate, polyglycidyl methacrylate, or polyacetoacetoxyethyl methacrylate.

The shell part may include at least one selected from polyethyleneamine, polyallylamine, polyvinylamine, polydimethylaminoethyl methacrylate, poly diallyldimethylammonium chloride, gelatin, bovine serum albumin, casein, or chitosan.

An exemplary embodiment also discloses a display apparatus including a display panel, a window member disposed on the display panel, and a thermally releasable adhesive member disposed between the display panel and the window member. The thermally releasable adhesive member includes a base resin and microcapsules dispersed and disposed in the base resin, the microcapsule includes a core part, a shell part wrapping the core part, and an organic solvent disposed in the core part, and an average diameter of the microcapsules is in a range of about 50 nm to about 500 nm.

A vaporization temperature of the organic solvent may be in a range of about 90° C. to about 110° C.

The thermally releasable adhesive member may include a first side adjacent to the window member, and a second side opposite to the first side and adjacent to the display panel. At least one of the first side or the second side may have a first adhesion strength at room temperature and at least one of the first side or the second side may have a second adhesion strength at the vaporization temperature in the thermally releasable adhesive member, and a relation of "second adhesion strength<0.9×(first adhesion strength)" may be satisfied.

The display apparatus may further include an optically clear adhesive member which may include the base resin but may not include the microcapsule, wherein the optically clear adhesive member may be disposed between the display panel and the thermally releasable adhesive member, or between the window member and the thermally releasable adhesive member.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
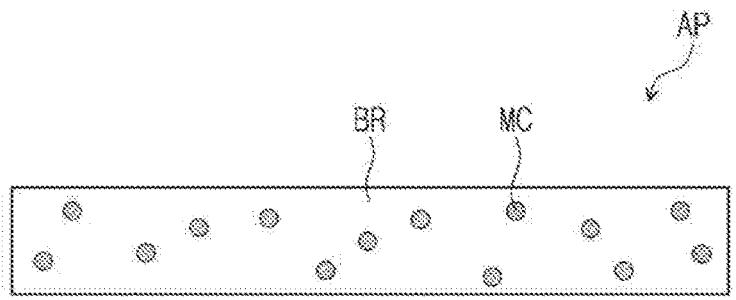
FIG. 1 is a cross-sectional view of a thermally releasable adhesive member according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view of a thermally releasable adhesive member according to an exemplary embodiment. A thermally releasable adhesive member AP according to an exemplary embodiment may include a base resin BR, and microcapsules MC dispersed and disposed in the base resin BR. The microcapsule MC may include a core part, a shell part which wraps the core part, and an organic solvent disposed in the core part.

The base resin BR may include at least one of an acryl-based resin, a silicone-based resin, a urethane-based resin, an epoxy-based resin, a rubber-based resin, or a polyester-based resin. For example, the base resin BR may be an adhesive resin including one or two or more of the acryl-based resin, the silicone-based resin, the urethane-based resin, the epoxy-based resin, the rubber-based resin, or the polyester-based resin.

Particularly, the base resin BR may include one selected from 2-ethylhexyl acrylate, butyl acrylate, vinyl acetate, methyl methacrylate, ethyl acrylate, methyl acrylate, benzyl acrylate, phenoxyethyl acrylate, acrylic acid, hydroxyethyl methacrylate, glycidyl methacrylate, or acetoacetoxyethyl methacrylate, or a combination thereof. In the thermally releasable adhesive member AP according to an exemplary embodiment, materials included in the base resin BR are not limited to the suggested compounds, but may further include known adhesive resins.

The base resin BR may be an optically clear polymer resin. The base resin BR may have a transmittance greater than or equal to about 90% in a visible light wavelength region. For example, the base resin BR may have a transmittance greater than or equal to about 90% in a wavelength range of about 400 nm to about 800 nm. More particularly, the base resin BR may have a transmittance greater than or equal to about 95% in a wavelength range of about 400 nm to about 800 nm.

Figure 2:
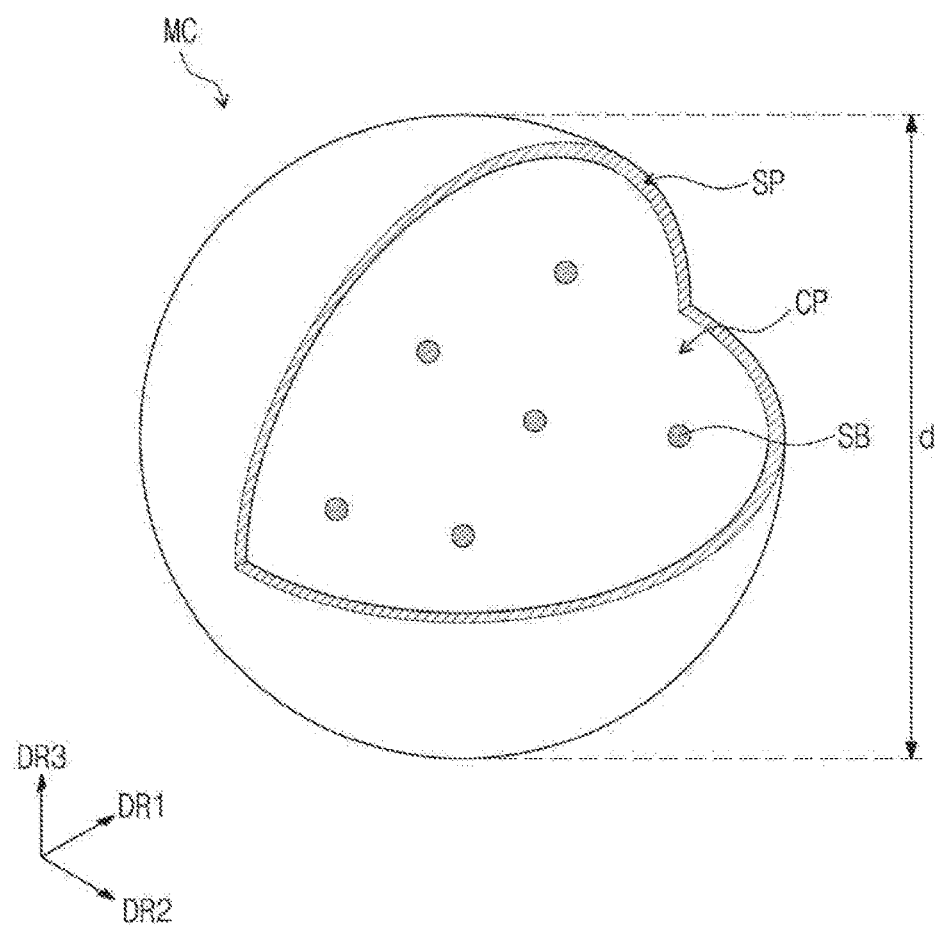
FIG. 2 schematically illustrates a microcapsule included in a thermally releasable adhesive member according to an exemplary embodiment.

The thermally releasable adhesive member AP according to an exemplary embodiment includes microcapsules MC dispersed and disposed in the base resin BR. The microcapsule MC may have a core-shell structure. FIG. 2 is a diagram schematically illustrating the shape of a microcapsule MC included in a thermally releasable adhesive member according to an exemplary embodiment.

Referring to FIG. 2, the microcapsule MC according to an exemplary embodiment may include a core part CP and a shell part SP wrapping the core part CP. In addition, the core part CP may include an organic solvent SB therein. The organic solvent SB may be collected and disposed in the core part CP of the microcapsule.

The microcapsule in FIG. 2 is illustrated as a spherical shape. However, the inventive concept is not limited thereto. For example, the microcapsule MC may have a circular or elliptical cross-section on a plane parallel to a plane defined by a directional axis of a first direction DR1 and a directional axis of a second direction DR2.

The microcapsule MC may be provided as a core-shell structure by forming a copolymer from a polymer constituting the core part CP and a polymer constituting the shell part SP, and then, the copolymer is self-assembled to form a micelle structure.

The core part CP of the microcapsule MC may include at least one selected from poly(2-ethylhexyl acrylate), polybutyl acrylate, polyvinyl acetate, polymethyl methacrylate, polyethyl acrylate, polymethyl acrylate, polybenzyl acrylate, polyphenoxyethyl acrylate, polyacrylic acid, polyhydroxyethyl methacrylate, polyglycidyl methacrylate, and polyacetoacetoxyethyl methacrylate.

The shell part SP of the microcapsule MC may include at least one selected from branched-polyethyleneimine (PEI), polyallylamine, polyvinylamine, polydimethylaminoethyl methacrylate, poly diallyldimethylammonium chloride, gelatin, bovine serum albumin, casein, and chitosan.

Particularly, the microcapsule MC may be composed of PEI-PMMA, and in this case, PEI may be disposed at the shell part SP, and PMMA may be disposed at the core part CP. However, the inventive concept is not limited thereto, and the microcapsule may be formed using a self-assemble method using at least one selected from the polymer resins constituting the core part CP and at least one selected from the polymer resins constituting the shell part SP. Meanwhile, an example embodiment is not limited thereto, and un-suggested two kinds of polymer resins or compounds may be self-assembled to form microcapsules having a core-shell type.

In the microcapsules MC of the core-shell structure, the shell part SP, which is exposed to the outside, may be relatively hydrophilic, and the core part CP, which is the inner part thereof, may be relatively hydrophobic. That is, the microcapsule may be an amphiphilic particle having both hydrophilic and hydrophobic properties.

The microcapsules MC may have an average diameter d of about 50 nm to about 500 nm. In particular, the microcapsules MC may have an average diameter d of about 200 nm to about 400 nm. The average diameter d of the microcapsules may represent an average value of the diameter of one microcapsule MC.

In a thermally releasable adhesive member AP according to an exemplary embodiment, there may be a plurality of microcapsules MC dispersed in the base resin BR, and the diameters of the plurality of microcapsules may be the same or different from each other.

In the case where the average diameter d of the microcapsules MC is greater than about 500 nm, the optical properties of a thermally releasable adhesive member AP may be deteriorated. A thermally releasable adhesive member AP, including microcapsules MC having an average diameter d greater than about 500 nm, may have a decreased optical transmittance and an increased haze value. That is, the thermally releasable adhesive member AP including microcapsules MC having an average diameter d greater than about 500 nm may have a decreased optical transmittance and an increased haze value, and may be inappropriately used as an adhesive member of a display apparatus.

As the size of the microcapsule MC is reduced, there is an improvement in the optical properties of the thermally releasable adhesive member AP. That is, the smaller the size of the microcapsule MC, the higher the transmittance of the thermally releasable adhesive member AP, and the smaller the haze value. However, in the case where the size of the microcapsule MC is less than about 50 nm, the amount included of an organic solvent SB in the microcapsule MC may be decreased significantly, and the thermally releasing properties of the thermally releasable adhesive member AP may be deteriorated.

The microcapsule MC may have a particle size satisfying Equation 1 below. Equation 1 below represents the relation of Rayleigh scattering due to a microcapsule MC. In Equation 1, R represents the distance from a light source to a microcapsule, θ represents the scattering angle of light, n represents the refractive index of a microcapsule, d represents the diameter of a microcapsule, λ represents the wavelength of a light source, and each of $I_0$ and I represents the initial intensity of light provided and the light intensity scattered by a microcapsule.

$$I = I_0 \frac{1+\cos^2\theta}{2R^2}\left(\frac{2\pi}{\lambda}\right)^4\left(\frac{n^2-1}{n^2+2}\right)^2\left(\frac{d}{2}\right)^6 \quad \text{Equation 1}$$

That is, the size of a microcapsule having a transmittance value which is required to maintain the optical properties of the thermally releasable adhesive member AP can be obtained from Equation 1. For example, in the case where the transmittance required for the thermally releasable adhesive member is greater than or equal to about 95%, the size of a microcapsule MC satisfying a relation of $I=0.95I_0$ may be obtained from Equation 1.

The average diameter d of microcapsules MC may be controlled by controlling the reaction time during preparing the microcapsules MC. For example, the average diameter d of the microcapsules MC may increase according to the increase of the reaction time between a polymer material constituting a core part CP and a polymer material constituting a shell part SP.

Particularly, referring to the Table 1 below, when preparing microcapsules MC having a PEI-PMMA structure and when setting the content ratio of PMMA on the basis of PEI the same, the average diameter of the microcapsules MC was increased from about 182 nm to about 399 nm with the increase of the reaction time from about 2 hours to about 12 hours.

TABLE 1

| Division | PEI content (g) | PMMA content (g) | Reaction time (hr) | Average diameter (nm) |
|---|---|---|---|---|
| Sample 1 | 2 | 0.8 | 2 | 182 |
| Sample 2 | 2 | 0.8 | 12 | 399 |

In the core part CP of the microcapsule MC, an organic solvent SB may be included. The organic solvent SB may be a liquid phase material having an optical isotropy. The organic solvent SB may have a vaporization temperature of about 90° C. to about 110° C. That is, the organic solvent SB included in the thermally releasable adhesive member AP according to an exemplary embodiment may be provided in a liquid phase and be vaporized at a temperature of about 90° C. to about 110° C. Here, the vaporization temperature of the organic solvent SB may represent the boiling point of the organic solvent in a liquid phase.

The organic solvent SB included in the thermally releasable adhesive member AP according to an exemplary embodiment may be a hydrophobic solvent. Particularly, the organic solvent SB used in an exemplary embodiment may be a solvent having a solubility less than or equal to about 1.0 with respect to water at room temperature. In this case, the solubility of the organic solvent with respect to water represents a ratio by weight (g) of an organic solvent dissolved in 100 g of water. The organic solvent SB having hydrophobicity may be disposed in a core part CP having hydrophobicity in a microcapsule MC. The room temperature for measuring the solubility of the organic solvent may be, for example, about 25° C.

For example, the organic solvent SB included in the core part CP of the microcapsule according to an exemplary embodiment may include at least one of methylcyclohexane, cyclohexane, cyclopentane, isooctane, tert-butyl acetate, heptene, and heptane.

In the case where heat having a temperature greater than the vaporization temperature of an organic solvent SB included in a core part CP is supplied to the thermally releasable adhesive member AP according to an exemplary embodiment, the organic solvent SB may be leaked out to the exterior of the microcapsule MC, thereby deteriorating the adhesiveness of the thermally releasable adhesive member AP. The vaporized organic solvent SB may move toward the surface of the thermally releasable adhesive member AP to deteriorate the adhesiveness at a side contacting with an object to be attached in the thermally releasable adhesive member AP.

The ratio of the adhesiveness of the thermally releasable adhesive member AP at the vaporization temperature of the organic solvent with respect to the adhesiveness of the thermally releasable adhesive member AP at room temperature may be less than or equal to 90%. That is, if the adhesion strength of the thermally releasable adhesive member AP at room temperature is the first adhesion strength, and the adhesion strength of the organic solvent at the vaporization temperature of the solvent is the second adhesion strength, a relation of "second adhesion strength<0.9×(first adhesion strength)" may be satisfied. For example, the adhesion strength of the thermally releasable adhesive member AP at the vaporization temperature of the organic solvent SB included in the microcapsules MC may decrease to about 5% of the adhesion strength thereof at room temperature.

The thermally releasable adhesive member AP according to an exemplary embodiment may have a transmittance of about 90% or more in a visible light region. That is, the thermally releasable adhesive member AP according to an exemplary embodiment may have a transmittance greater than or equal to about 90% in a wavelength range of about 400 nm to about 800 nm. In addition, the haze value of the thermally releasable adhesive member AP according to an exemplary embodiment may be less than or equal to about 0.1%. The haze value may be measured using a haze meter. Since the thermally releasable adhesive member AP according to an exemplary embodiment includes microcapsules MC having a nano scale size and has a high light transmittance greater than or equal to about 90% and a low haze value less than or equal to 0.1%, the adhesive member AP may be used as an adhesive member requiring optical transparency.

In the thermally releasable adhesive member AP according to an exemplary embodiment, the absolute value of the difference of refractive indices of the base resin BR and the microcapsule MC may be less than or equal to 0.1. That is, the optical properties of the thermally releasable adhesive member AP may be improved by controlling the difference of refractive indices of the base resin BR and the microcapsule MC to be less than or equal to 0.1.

The light transmittance of the thermally releasable adhesive member AP may be increased and the haze value may be decreased by controlling the absolute value of the difference of refractive indices of the base resin BR and the microcapsule MC to be less than or equal to 0.1. In addition, in the thermally releasable adhesive member AP according to an exemplary embodiment, the absolute value of the difference of refractive indices of the microcapsule MC and the organic solvent SB disposed in the core part CP of the microcapsule may be less than or equal to 0.1. That is, light distortion phenomenon due to the microcapsule MC in the thermally releasable adhesive member AP may be decreased by maintaining the difference of refractive indices of the base resin BR and the microcapsule MC to a small value of less than or equal to 0.1.

In the thermally releasable adhesive member AP according to an exemplary embodiment, the microcapsule MC may be in included in an amount ratio of about 0.01 wt % to about 20 wt %. That is, on the basis of 100 of the total weight of the base resin BR and the microcapsules MC, the microcapsules may be included from about 0.01 wt % to about 20 wt %. In the case where the amount included of the microcapsules is less than about 0.01 wt %, the thermally releasable adhesive member AP according to an exemplary embodiment may have a small reduction width of adhesion strength at a high temperature and may not be served as a thermally releasable adhesive member.

In addition, in the case where the amount of the microcapsules is greater than about 20 wt %, the initial adhesion strength of the thermally releasable adhesive member AP may decrease, and the phase separation of the microcapsules MC may be generated due to the deterioration of the compatibility of the hydrophobic base resin BR and the microcapsules MC due to the hydrophilic properties of the shell part SP of the microcapsules MC.

In Table 2, the adhesion strength at room temperature based on the amount of microcapsules MC included in a base resin BR is compared. In Table 2, the amount ratio of the microcapsules MC represents a relative weight ratio when the total weight of the base resin BR and the microcapsules MC is 100. In the case where the amount ratio of the microcapsules is 0, the adhesive member is composed of only the base resin. The relative adhesion strength represents a relative adhesion strength ratio when the adhesion strength with the 0 amount ratio of the microcapsules MC is 100. The adhesion strength was measured at room temperature prior to providing heat at a high temperature.

TABLE 2

| Division | Amount ratio of microcapsules (wt %) | | | |
|---|---|---|---|---|
| | 0 | 0.05 | 0.1 | 1.0 |
| Relative adhesion strength (%) | 100 | 97.2 | 83.4 | 77.7 |

Referring to the results of Table 2, the relative adhesion strength decreases in line with the increase of the amount ratio of the microcapsules MC. In Table 2, the results are shown up to the amount ratio of the microcapsules of about 1.0 wt %, but good adhesion strength values are obtainable at room temperature up to the amount ratio of the microcapsules of about 20 wt %. However, in the case where the amount of the microcapsules MC is greater than about 20 wt %, the reduction width of the adhesion strength at room temperature may increase, thereby deteriorating initial adhesion strength properties as an adhesive member.

The thermally releasable adhesive member AP according to an exemplary embodiment may further include a tackifying resin, a photoinitiator, or a cross-linking agent in addition to the base resin BR and the microcapsules MC.

Figure 3A:
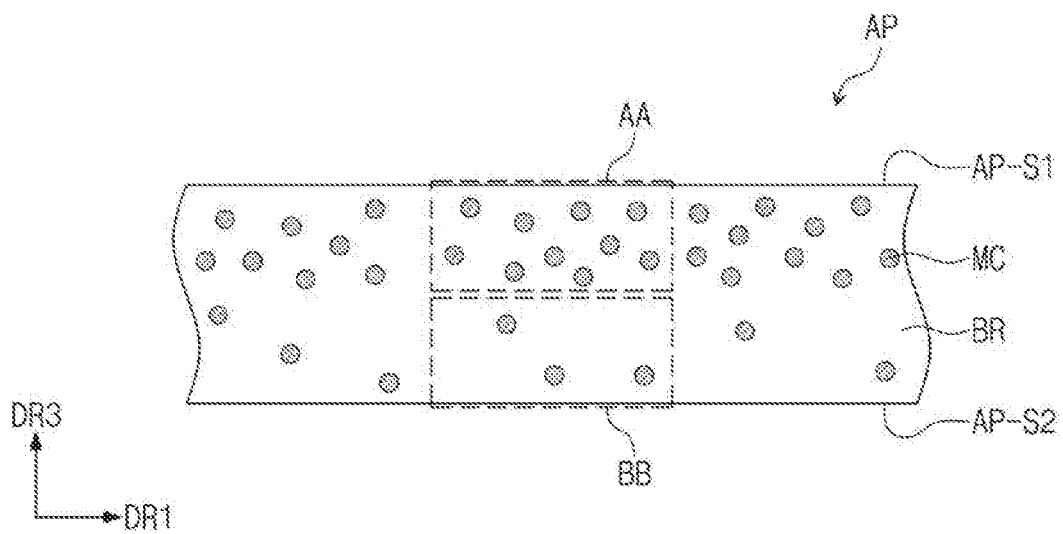
FIG. 3A and FIG. 3B are cross-sectional views of thermally releasable adhesive members according to exemplary embodiments.
Figure 3B:
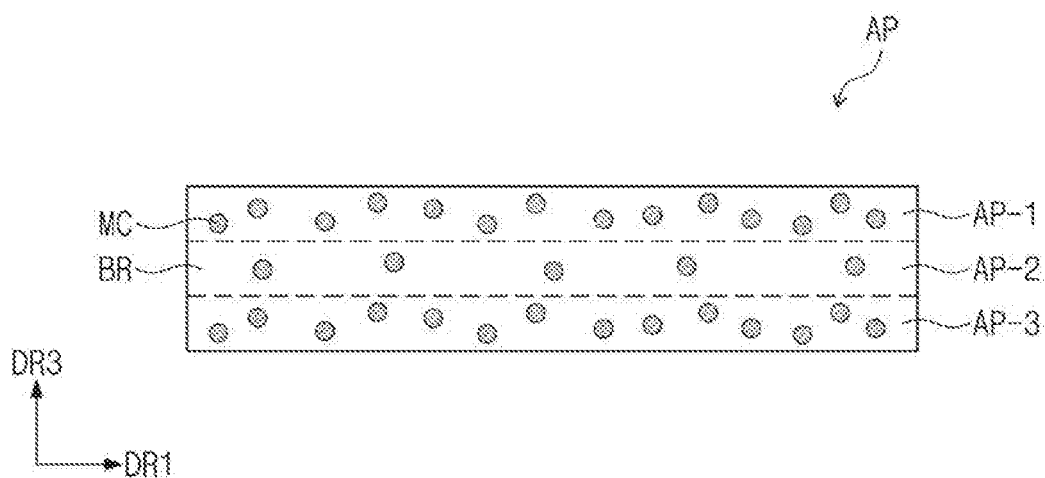

FIGS. 3A to 3B are enlarged cross-sectional views of thermally releasable adhesive members according to exemplary embodiments. The thermally releasable adhesive member AP may include one side and the opposite other side, and the distribution density of microcapsules MC may decrease from the one side to the other side. The thermally releasable adhesive member AP may be a double-sided adhesive sheet including a first side and a second side according to an exemplary embodiment.

In FIG. 3A, the first side AP-S1 is the top side of the thermally releasable adhesive member AP, and the second side AP-S2 is the bottom side of the thermally releasable adhesive member AP. Referring to FIG. 3A, the distribution density of the microcapsules MC distributed in a first area AA, which is adjacent to the first side AP-S1 per unit area, may be greater than the distribution density of the microcapsules MC distributed in a second area BB, which is adjacent to the second side AP-S2. That is, in the thermally releasable adhesive member AP shown in FIG. 3A, the distribution density of the microcapsules MC dispersed in the base resin BR may increase toward a third direction DR3, which is a thickness direction of the thermally releasable adhesive member AP.

Alternatively, although not shown, the distribution density of the microcapsules MC may decrease toward the third direction DR3, which is a thickness direction in the thermally releasable adhesive member AP. That is, in the cross-section of the thermally releasable adhesive member AP, the distribution density of the microcapsules MC per unit area may not be uniform and may increase or decrease toward the top side or the bottom side.

In FIG. 3B, the thermally releasable adhesive member AP according to an exemplary embodiment may include a first adhesive part AP-1 in which microcapsules MC are dispersed with a first density, a second adhesive part AP-2 in which microcapsules MC are dispersed with a second density, and a third adhesive part AP-3 which is disposed between the first adhesive part AP-1 and the second adhesive part AP-2 and in which microcapsules MC are dispersed with a third density. In this case, the third density may be less than or equal to the first density or the second density. That is, the distribution density of the microcapsules MC in the central part in the thermally releasable adhesive member AP may be smaller than the distribution density of microcapsules MC at both sides with the central part as the center. For example, the first density and the second density may be the same, and the third density may be smaller than the first density or the second density. In addition, the first density and the second density may be different from each other.

In an exemplary embodiment, the microcapsules MC may be mainly disposed adjacent to the surface of the thermally releasable adhesive member AP. Particularly, the distribution density of the microcapsules MC may increase from the central part toward the top side and the bottom side in the thermally releasable adhesive member AP. That is, the detachment of the thermally releasable adhesive member AP under heating conditions at a high temperature may be readily performed by increasing the distribution density of the microcapsules MC toward the top side or the bottom side, to which an object to be attached is adjacently disposed in the thermally releasable adhesive member AP according to an embodiment.

Although not shown in FIGS. 3A and 3B, the density of the microcapsules MC dispersed in the base resin BR in the thermally releasable adhesive member AP according to an exemplary embodiment may be diversely controlled according to the position and use of the thermally releasable adhesive member AP.

The thermally releasable adhesive member AP according to an exemplary embodiment may be provided as a double-sided adhesive sheet or an adhesive resin type. For example, the thermally releasable adhesive member AP according to an exemplary embodiment may be provided as a double-sided tape type in which a first side and a second side, which are exposed, are bonded with objects to be attached, respectively. The thermally releasable adhesive member provided as a double-sided tape type may include partially uncured adhesive resin, and the uncured adhesive resin may be cured through an ultraviolet curing process.

The thermally releasable adhesive member according to an exemplary embodiment may be provided as an adhesive resin type with a liquid phase. The thermally releasable adhesive member provided in a liquid phase may be transformed into a fixed adhesive member type through an ultraviolet curing process. The thermally releasable adhesive member provided as an adhesive resin in a liquid phase may be directly provided on a side for attaching and then may be solidified through an ultraviolet curing process to form an adhesive layer.

The thermally releasable adhesive member AP according to an exemplary embodiment may have a light transmittance greater than or equal to about 90% and a haze value less than or equal to about 0.1%, and may be used as an optically clear adhesive (OCA) or an optically clear resin (OCR) in a display apparatus.

FIGS. 4A to 6 are exemplary embodiments of display apparatuses including the thermally releasable adhesive members according to exemplary embodiments. Referring to FIGS. 4A to 6, display apparatuses according to exemplary embodiments will be explained. In the explanation on the display apparatuses according to exemplary embodiments, overlapping parts with the above-description on the thermally releasable adhesive member according to an embodiment will not be explained again.

Figure 4A:
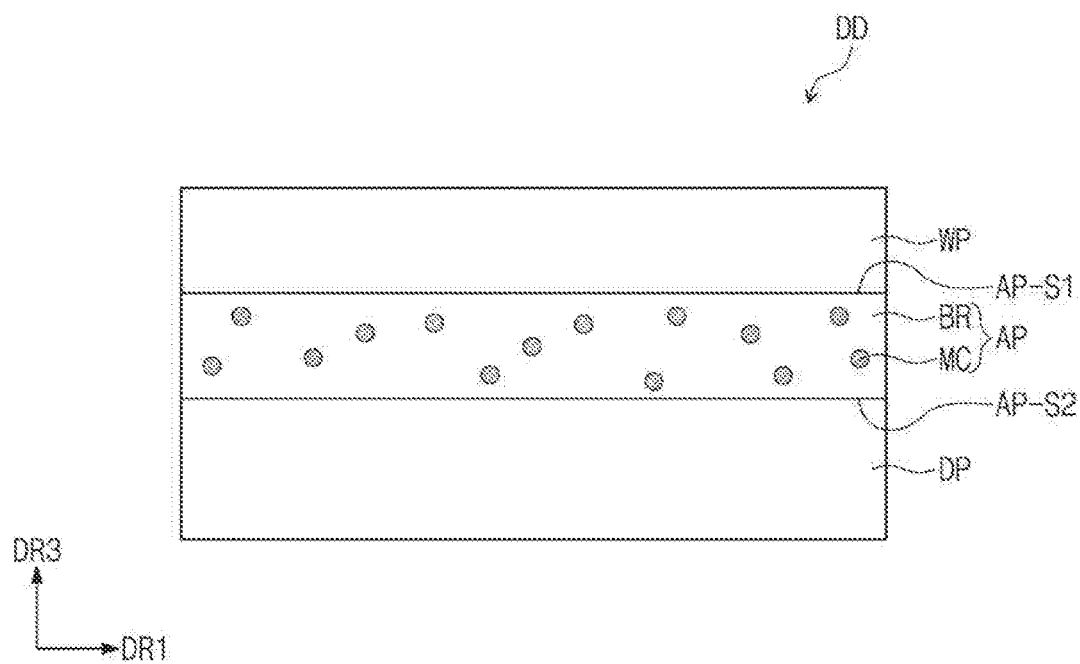
FIG. 4A and FIG. 4B are cross-sectional views of display apparatuses according to exemplary embodiments.

The display apparatus DD shown in FIG. 4A according to an exemplary embodiment may include a display panel DP, a window member WP disposed on the display panel DP, and a thermally releasable adhesive member AP disposed between the display panel DP and the window member WP. The thermally releasable adhesive member AP may include a base resin BR and microcapsules MC dispersed in the base resin BR. The microcapsule MC may include a core part CP (FIG. 2), a shell part SP (FIG. 2) wrapping the core part CP (FIG. 2), and an organic solvent SB disposed in the core part CP (FIG. 2). The microcapsules MC may have an average diameter from about 50 nm to about 500 nm.

In the display apparatus DD according to an exemplary embodiment, the above-explanation regarding the thermally releasable adhesive member AP according to an exemplary embodiment may be applied to the thermally releasable adhesive member AP.

The display panel DP may produce images and provide the images thus produced on the front side where the window member WP is disposed. The display panel DP may provide the images produced toward a third direction DR3. For example, the display panel DP may be a liquid crystal display panel, an organic light emitting display panel, a plasma display panel, an electrophoretic display panel, a microelectromechanical system (MEMS) display panel, or an electrowetting display panel.

The window member WP may be disposed on the display panel DP. The window member WP may cover the front side of the display panel DP and may be disposed to protect the display panel DP. For example, the area of the window member WP exposed to the front side may be greater than the area of the top side of the display panel DP which is opposed to the window member WP.

The window member WP may be a glass material. For example, a tempered glass substrate may be used as the window member WP. Alternatively, the window member WP may be formed using a flexible plastic material. For example, the window member WP of a plastic material may be formed using polyimide, polyacrylate, polymethyl methacrylate (PMMA), polycarbonate (PC), polyethylenenaphthalate (PEN), polyvinylidene chloride, polyvinylidene difluoride (PVDF), polystyrene, an ethylene vinyl alcohol copolymer, or a combination thereof. However, the inventive concept is not limited thereto, and a common type known as the window member WP may be used without limitation.

The window member WP may further include a functional layer (not shown). For example, the functional layer (not shown) may be a hard coating layer, a fingerprint-resistant coating layer, etc. However, the inventive concept is not limited thereto.

The thermally releasable adhesive member AP may be disposed between the display panel DP and the window member WP. The first side AP-S1 of the thermally releasable adhesive member AP may make contact with the window member WP, and the second side AP-S2 opposing the first side AP-S1 may make contact with the display panel DP. The thermally releasable adhesive member AP may combine the display panel DP and the window member WP. The thermally releasable adhesive member AP may have a light transmittance greater than or equal to about 90% and a haze value less than or equal to about 0.1% so as to serve as an optically clear adhesive layer in a display apparatus DD.

In the display apparatus DD according to an exemplary embodiment, the microcapsules MC of the thermally releasable adhesive member AP may include an organic solvent having a vaporization temperature of about 90° C. to about 110° C. The organic solvent may be a material in a liquid phase having an optical isotropy.

The organic solvent is present in a collected state in the microcapsule in a liquid phase at room temperature which corresponds to commonly used conditions. If heat having a temperature higher than the vaporization temperature of the organic solvent is supplied, the organic solvent in the microcapsules MC may vaporize and leak out from the microcapsules MC.

In the case where the vaporization temperature of the organic solvent is less than about 90° C. in an exemplary embodiment, the organic solvent may vaporize under commonly used conditions of a display apparatus DD and leak out from the microcapsules, thereby deteriorating the adhesion strength of the thermally releasable adhesive member. In addition, in the case where the vaporization temperature of the organic solvent is higher than about 110° C., heat having a temperature higher than about 110° C. is required to be supplied to detach the thermally releasable adhesive member. Accordingly, the members of the display panel DP or the window member WP are exposed to the high temperature, and the reliability of the display apparatus may be deteriorated.

Figure 4B:
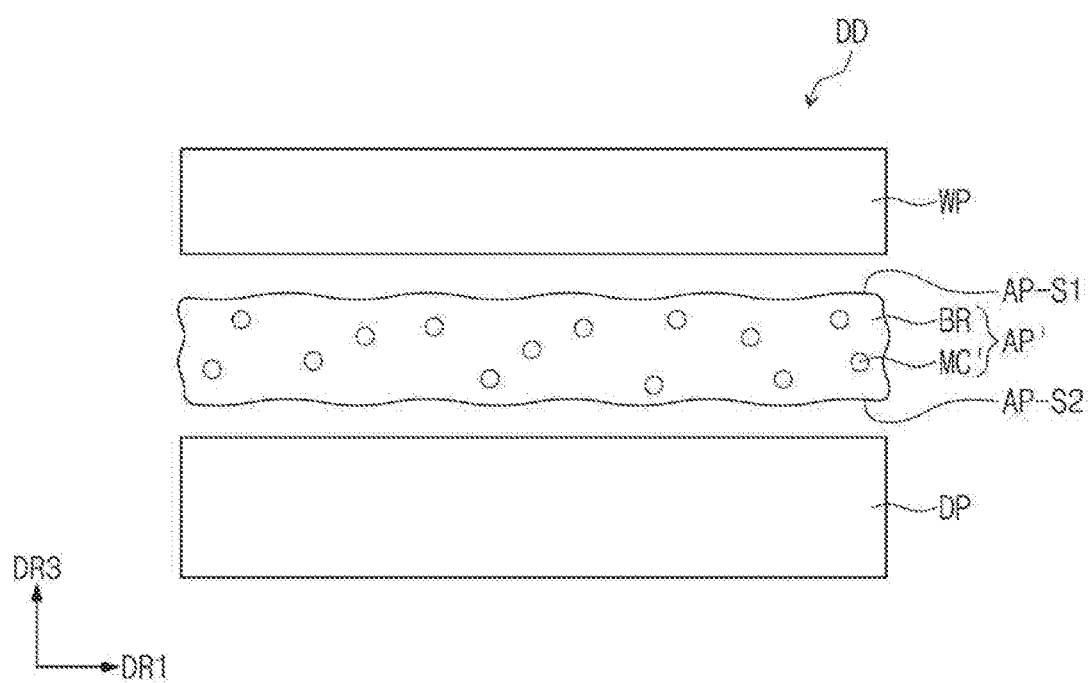

FIG. 4B is a diagram on a case when heat having a temperature higher than the vaporization temperature of an organic solvent is provided to a display apparatus DD according to an exemplary embodiment. Referring to FIG. 4B, both the top side, which is the first side AP-S1 adjacent to the window member WP of the thermally releasable adhesive member AP', and the second side AP-S2, which is the bottom side of the thermally releasable adhesive member AP' adjacent to the display panel DP may be detached from the window member WP and the display panel DP, which are objects for attaching.

In FIG. 4B, the organic solvent may be leaked out from the microcapsules MC' and move from the thermally releasable adhesive member AP' toward the first side AP-S1 and the opposing second side AP-S2. In FIG. 4B which is a state after providing heat, the inner parts of the microcapsules MC' may not include the organic solvent or may include a small amount of the organic solvent when compared to the microcapsules MC of the thermally releasable adhesive member AP shown in FIG. 4A.

The thermally releasable adhesive member AP' is detached at both sides thereof in FIG. 4B. However, the inventive concept is not limited thereto. For example, in the case where the thermally releasable adhesive member AP is included in the display apparatus DD according to an exemplary embodiment, the thermally releasable adhesive member AP may be detached from an object for attaching only at the first side AP-S1, in which the distribution density of the microcapsules MC is large.

Referring to FIGS. 4A to 4B, the thermally releasable adhesive member AP included in the display apparatus DD may include the first side AP-S1, which is adjacent to the window member WP, and the second side AP-S2, which opposes the first side AP-S1 and adjacent to the display panel DP.

The adhesion strength of the thermally releasable adhesive member AP on at least one side of the first side AP-S1 and the second side AP-2 at a temperature higher than the vaporization temperature of the organic solvent included in the microcapsules MC may be less than or equal to 90% of the adhesion strength of the thermally releasable adhesive member AP on at least one side of the first side AP-S1 or the second side AP-S2 at room temperature. That is, in the case where the thermally releasable adhesive member has a first adhesion strength with respect to at least one side of the first side AP-S1 or the second side AP-S2 at room temperature and has a second adhesion strength with respect to at least one side of the first side AP-S1 or the second side AP-S2 at the vaporization temperature, a relation of "second adhesion strength<0.9×(first adhesion strength)" may be satisfied.

For example, the adhesion strength of the thermally releasable adhesive member AP at a temperature higher than the vaporization temperature of the organic solvent decreases when compared to the adhesion strength thereof at room temperature, and may decrease to less than or equal to about 70% than the adhesion strength thereof at room temperature. In addition, the adhesion strength of the thermally releasable adhesive member AP after supplying heat having a temperature higher than the vaporization temperature of the organic solvent may decrease to about 5% of the adhesion strength thereof at room temperature.

The display apparatus DD according to an exemplary embodiment includes the thermally releasable adhesive member AP, of which adhesion strength decreases at a high temperature, and the members bonded during the manufacturing process of the display apparatus DD may be easily separated at high temperature conditions. Accordingly, in the case where the reassembly of the display apparatus DD is required, the thermally releasable adhesive member AP may be detached without damaging the other members to improve the re-workability and productivity of the display apparatus DD.

Figure 5A:
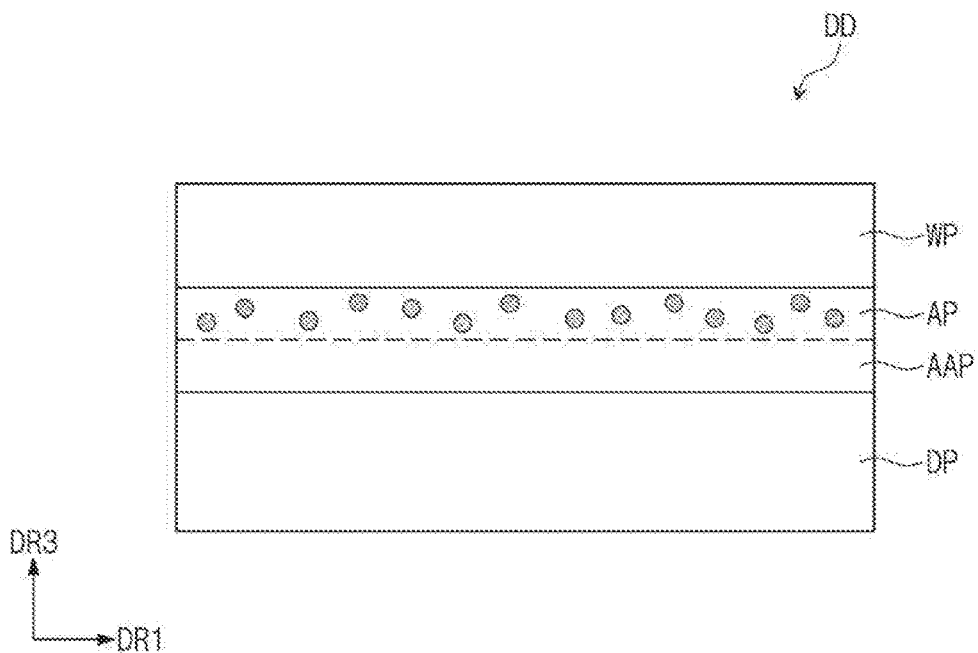
FIG. 5A to FIG. 5B are cross-sectional views of display apparatuses according to exemplary embodiments.
Figure 5B:
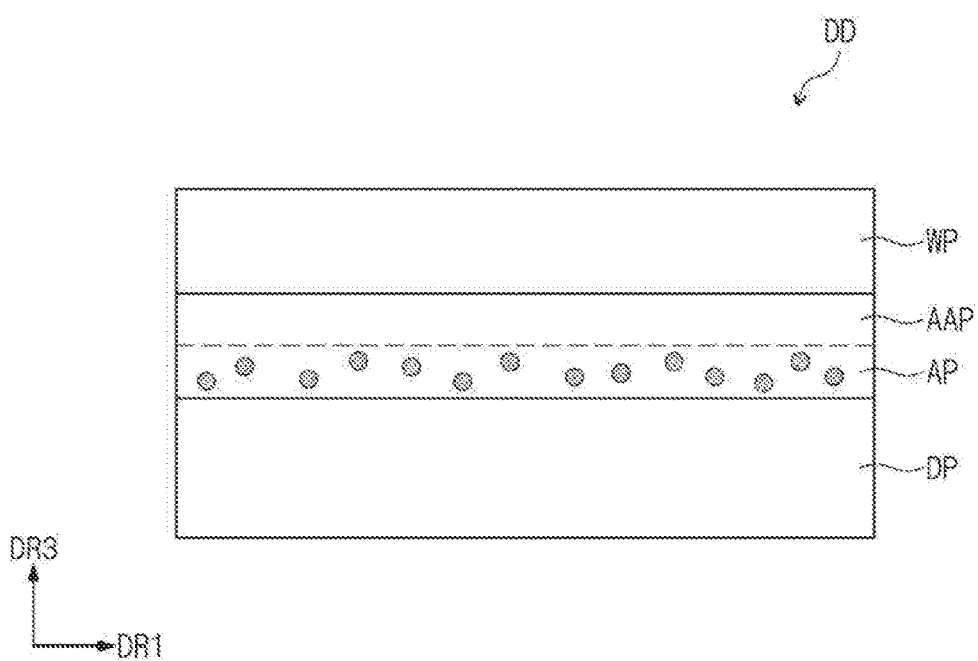

FIGS. 5A to 5B are cross-sectional views of display apparatuses DD according to exemplary embodiments. Referring to FIGS. 5A to 5B, a display apparatus DD according to an exemplary embodiment may include a display panel DP, a window member WP disposed on the display panel DP, and a thermally releasable adhesive member AP disposed between the display panel DP and the window member WP. In addition, the display apparatus DD according to an exemplary embodiment may further include an optically clear adhesive member AAP disposed on the thermally releasable adhesive member AP. The optically clear adhesive member AAP may be disposed between the display panel DP and the thermally releasable adhesive member AP, or between the window member WP and the thermally releasable adhesive member AP.

FIG. 5A is a case where the optically clear adhesive member AAP is disposed between the display panel DP and the thermally releasable adhesive member AP. That is, the optically clear adhesive member AAP may be disposed adjacent to the display panel DP, and the thermally releasable adhesive member AP disposed on the optically clear adhesive member AAP may be disposed adjacent to the window member WP. In the exemplary embodiment of FIG. 5A, in the microcapsules included in the thermally releasable adhesive member AP, an organic solvent having a vaporization temperature of about 90° C. to about 110° C. may be included. In the case where heat having a temperature higher than the vaporization temperature of the organic solvent is provided to the display apparatus DD, the interface of the window member WP and the thermally releasable adhesive member AP may be separated in the exemplary embodiment of FIG. 5A.

FIG. 5B is a case where the optically clear adhesive member AAP is disposed between the window member WP and the thermally releasable adhesive member AP. That is, the thermally releasable adhesive member AP may be disposed adjacent to the display panel DP, and the optically clear adhesive member AAP disposed on the thermally releasable adhesive member AP may be disposed adjacent to the window member WP. In the exemplary embodiment of FIG. 5B, in the microcapsules included in the thermally releasable adhesive member AP, an organic solvent having a vaporization temperature of about 90° C. to about 110° C. may be included. In the case where heat having a temperature higher than the vaporization temperature of the organic solvent is provided to the display apparatus DD, the interface of the display panel DP and the thermally releasable adhesive member AP may be separated in an embodiment of FIG. 5B.

The optically clear adhesive member AAP may include the base resin but may not include the microcapsules when compared to the thermally releasable adhesive member AP.

The optically clear adhesive member may include a base resin including one selected from 2-ethylhexyl acrylate, butyl acrylate, vinyl acetate, methyl methacrylate, ethyl acrylate, methyl acrylate, benzyl acrylate, phenoxyethyl acrylate, acrylic acid, hydroxyethyl methacrylate, glycidyl methacrylate or acetoacetoxyethyl methacrylate, or a combination thereof. Meanwhile, the material included in the base resin in the optically clear adhesive member AAP according to an embodiment is not limited to the above-suggested compounds, but may further include known adhesive resins.

The optically clear adhesive member AAP and the thermally releasable adhesive member AP may be provided in one body. For example, the optically clear adhesive member AAP and the thermally releasable adhesive member AP may be provided in a combined state as an adhesive layer.

Differently, the optically clear adhesive member AAP and the thermally releasable adhesive member AP may be provided in individual processes. For example, the optically clear adhesive member AAP may be firstly provided to an object to be attached, and then, the thermally releasable adhesive member AP may be provided on the optically clear adhesive member AAP. Differently, the thermally releasable adhesive member AP may be firstly provided to an object to be attached, and then, the optically clear adhesive member AAP may be provided on the thermally releasable adhesive member AP. In addition, each of the optically clear adhesive member AAP and the thermally releasable adhesive member AP may be provided to an object to be attached, and then, the optically clear adhesive member AAP and the thermally releasable adhesive member AP may be combined with each other.

In the display apparatuses DD shown in FIGS. 5A to 5B, the thickness of the thermally releasable adhesive member AP and the optically clear adhesive member AAP may be the same or different. For example, the thickness of the thermally releasable adhesive member AP may be less than or equal to the thickness of the optically clear adhesive member AAP.

In the display apparatuses DD shown in FIGS. 5A to 5B, one layer of the thermally releasable adhesive member AP and one layer of the optically clear adhesive member AAP are laminated. However, the inventive concept is not limited thereto. For example, in a display apparatus according to an exemplary embodiment, two thermally releasable adhesive members AP may be disposed at both sides of an optically clear adhesive member AAP.

Figure 6:
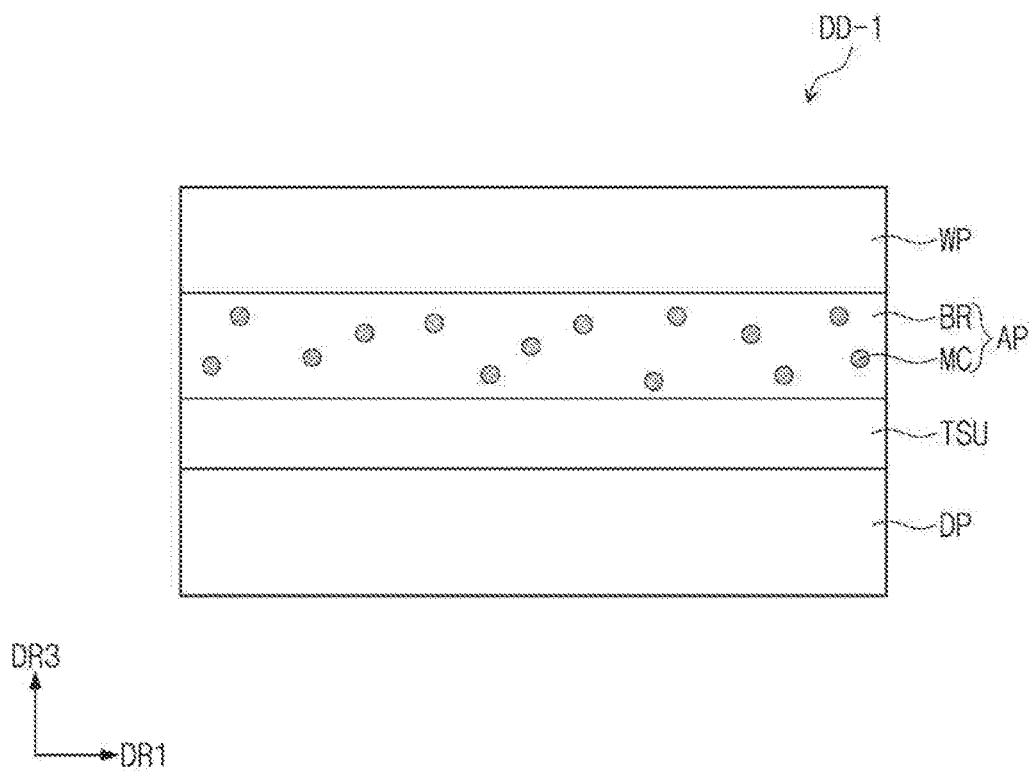
FIG. 6 is a cross-sectional view of a display apparatus according to an exemplary embodiment.

FIG. 6 is a cross-sectional view of a display apparatus according to an exemplary embodiment. A display apparatus DD-1 according to an exemplary embodiment may further include a touch sensing unit TSU between a display panel DP and a window member WP. Referring to FIG. 6, the touch sensing unit TSU may be disposed on the display panel DP and may be disposed between the display panel DP and a thermally releasable adhesive member AP. In an exemplary embodiment, the thermally releasable adhesive member AP may include a base resin BR and microcapsules MC dispersed in the base resin BR. The microcapsule has a core-shell structure including a core part and a shell part, and in the core part, an organic solvent having a vaporization temperature of about 90° C. to about 110° C. may be included.

In the case where heat having a temperature higher than the vaporization temperature of the organic solvent is supplied to the display apparatus DD-1, the adhesion strength of the thermally releasable adhesive member AP may decrease, and the detachment of the thermally releasable adhesive member AP from the contact side with the window member WP and the touch sensing unit TSU may be easy.

The touch sensing unit TSU is disposed directly on the display panel DP in FIG. 6. However, the inventive concept is not limited thereto. In the display apparatus DD-1 according to an exemplary embodiment, the touch sensing unit TSU may be disposed directly on the display panel DP without using a separate adhesive member. However, differently, an adhesive member may be further provided between the touch sensing unit TSU and the display panel DP.

Although not shown in the drawing, in the case where the adhesive member is provided between the display panel DP and the touch sensing unit TSU, the adhesive member provided may be a thermally releasable adhesive member or an optically clear adhesive member.

The thermally releasable adhesive member according to an exemplary embodiment includes microcapsules having a nano scale, and has good optical properties and decreases adhesion strength via leaking out the organic solvent in the microcapsules at high temperature conditions so as to attain re-workability.

In addition, the display apparatus according to an exemplary embodiment includes a thermally releasable adhesive member, and may easily detach the adhesive member by supplying heat, thereby improving re-workability and productivity when manufacturing a display apparatus.

Hereinafter, referring to examples and comparative examples, a method for manufacturing a thermally releasable adhesive member according to an exemplary embodiment of the inventive concept and the evaluation of the properties thereof will be explained in particular. In addition, the following examples are only illustrations to assist the understanding of the inventive concept, and the scope of the inventive concept is not limited thereto.

EXAMPLES

1. Method of Preparing Microcapsules

A method for manufacturing microcapsules included in a thermally releasable adhesive member according to the inventive concept will be explained in detail referring to exemplary embodiments. In addition, the method for manufacturing microcapsules explained below is only one exemplary embodiment, and the method for manufacturing microcapsules according to the inventive concept is not limited thereto. For example, the method for manufacturing microcapsules according to the inventive concept is not limited to the suggested reaction conditions, but any conditions known in the technical art may be applied without limitation.

16.8 g of deionized (DI) water and 2.0 g of branched polyethyleneimine were added to a two-necked flask, followed by stirring for about 30 minutes. Then, a condenser was installed under a nitrogen purging, and stirring was performed at about 80° C. at a rate of about 900 rpm for about 30 minutes.

Then, 0.8 g of methyl methacrylate and 256 µg of tert-butylhydroperoxide were added thereto, followed by stirring at about 80° C. for about 2 hours. After that, particles were separated using a centrifuge, filtered, and dried in vacuum for about 24 hours to produce microcapsules having a PEI-PMMA structure.

100 mg of the microcapsules thus synthesized were dissolved in 10 ml of deionized water, and 1 ml of methylcyclohexane was added thereto, followed by stirring at a rate of about 1,500 rpm, at about 60° C. for about 6 hours to produce microcapsules encapsulating a methylcyclohexane organic solvent. The microcapsules thus produced included a core part of PMMA and a shell part of PEI, methylcyclohexane was included in the core part, and the average diameter of the microcapsules was about 200 nm.

2. Method of Manufacturing Thermally Releasable Adhesive Member

To a PMMA resin, which was a base resin, the microcapsules thus manufactured were added and stirred for about 30 minutes to produce an adhesive resin for a thermally releasable adhesive member. In this case, the microcapsules were manufactured so as to be included in an amount ratio of about 0.05, about 0.1, and about 1.0 wt % on the basis of the total amount of the base resin and the microcapsule.

Figure 7:
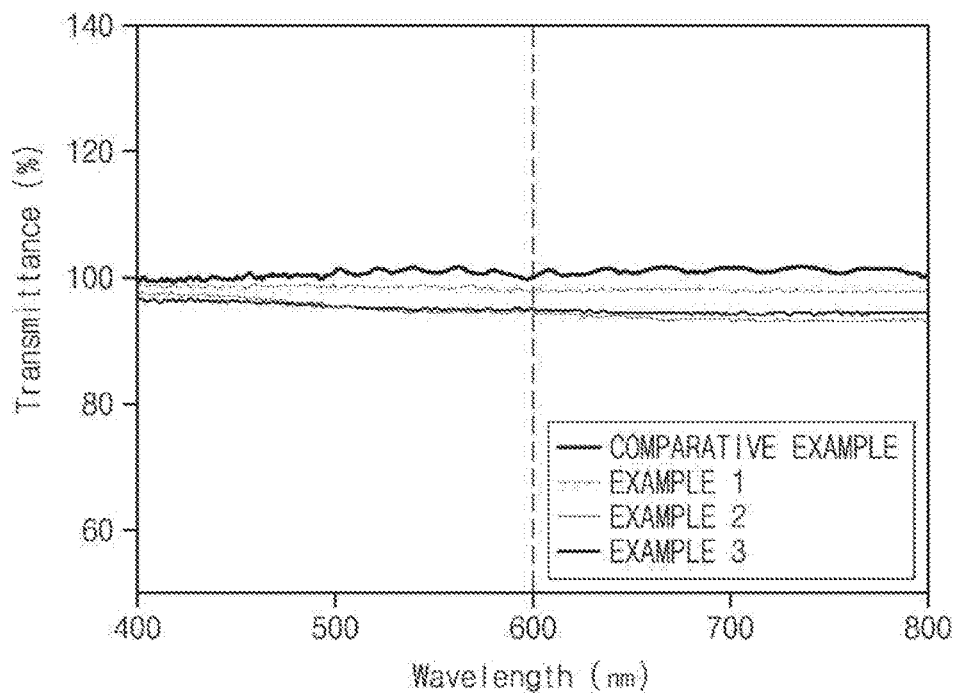
FIG. 7 is a diagram illustrating light transmittance of a thermally releasable adhesive member according to an exemplary embodiment.

3. Evaluation of Thermally Releasable Adhesive Member
(1) Evaluation of Light Transmittance Light transmittance was measured for examples and comparative example using a UV-Vis spectrometer. Table 3 represents the configurations of adhesive members according to the comparative example and the examples and light transmittance values at corresponding wavelengths. In addition, FIG. 7 is a diagram illustrating the evaluation results of light transmittance in the comparative example and the examples. The light transmittance value is relative light transmittance when the light transmittance of the comparative example at the wavelength of about 600 nm is 100%.

The evaluation specimens of the comparative example and the examples were evaluated after providing an adhesive resin between two glass substrates and irradiating ultraviolet lights to form an adhesive layer having a thickness of about 100 µm. The comparative example includes an OCA adhesive layer not including microcapsules, and the examples include microcapsules having a core part of PMMA and a shell part of PEI and including methylcyclohexane in the core part. The average diameter of the microcapsules was about 200 nm. Example 1 includes about 0.05 wt % of the microcapsules, Example 2 includes about 0.1 wt % of the microcapsules, and Example 3 includes about 1.0 wt % of the microcapsules.

TABLE 3

| Division | Wavelength | | |
|---|---|---|---|
| | 400 nm | 600 nm | 800 nm |
| Comparative Example | 99.4% | 100% | 100.5% |
| Example 1 | 98.8% | 97.9% | 97.9% |
| Example 2 | 97.6% | 94.5% | 93.2% |
| Example 3 | 96.4% | 94.7% | 94.3% |

Referring to Table 3 and FIG. 7, the thermally releasable adhesive members containing the microcapsules according to the examples tend to have partially decreased light transmittance when compared to that not containing the microcapsules according to the comparative example. However, the light transmittance greater than or equal to about 90% in the whole visible wavelength region was secured. In particular, in example 1, in which the amount of the microcapsules was about 0.05 wt %, high light transmittance greater than or equal to about 97% was attained in a wavelength range of about 400 nm to about 800 nm.

(2) Evaluation of Adhesion Strength of Thermally Releasable Adhesive Member

The adhesion strength change of the thermally releasable adhesive member according to the thermal treatment time was evaluated. The adhesion strength was evaluated for an example including about 0.1 wt % of microcapsules. An adhesive resin including about 0.1 wt % of the microcapsules was provided between two glass substrates, and ultraviolet light was irradiated to form a thermally releasable adhesive member having a thickness of about 100 µm. The thermally releasable adhesive member according to the example included microcapsules having a core part of PMMA and a shell part of PEI, and including methylcyclohexane in the core part. The average diameter of the microcapsules was about 200 nm.

Figure 8:
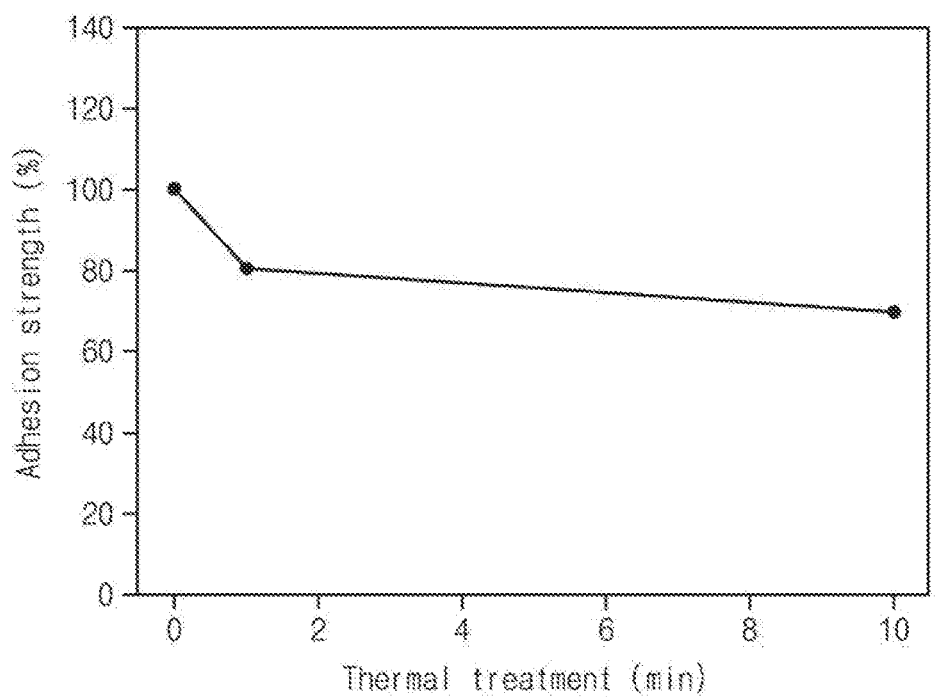
FIG. 8 is a diagram illustrating adhesiveness properties of a thermally releasable adhesive member according to an exemplary embodiment.

Table 4 and FIG. 8 illustrate adhesion strength in accordance with thermal treatment time. The adhesion strength represents relative adhesion strength when an initial adhesion strength to which heat was not supplied was 100. The temperature of the thermal treatment was about 100° C. Referring to Table 4 and FIG. 8, the adhesion strength decreased with the increase of the thermal treatment time, and the adhesion strength decreased to about 69% when the thermal treatment time was about 10 minutes when compared to the initial adhesion strength.

TABLE 4

| Division | Thermal treatment time (min) | | |
|---|---|---|---|
| | 0 | 1 | 10 |
| Adhesion strength (%) | 100 | 80.3 | 69.5 |

The thermally releasable adhesive member according to an exemplary embodiment includes microcapsules having a nano scale and includes an organic solvent in the microcapsules, and thus, attains a high light transmittance and a low haze value and may be easily detached at high temperature conditions. In addition, the thermally releasable adhesive member may have good optical properties and deteriorate adhesion strength by supplying heat, and may be used in diverse uses which require optical transparency and reworking.

In addition, the re-workability during the manufacturing process of the display apparatus according to an exemplary embodiment may be improved by including the thermally releasable adhesive member. In particular, the thermally releasable adhesive member according to an exemplary embodiment may have improved productivity of a display apparatus by easily removing the thermally releasable adhesive member without damaging the other adjacent members of the display apparatus by decreasing the adhesion strength thereof by leaking an organic solvent in microcapsules.

A thermally releasable adhesive member according to an exemplary embodiment includes microcapsules including an organic solvent, and may attain an adhesive member of which adhesion strength is deteriorated at a high temperature and may improve re-workability of a display apparatus by using the adhesive member in the display apparatus.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A thermally releasable adhesive member, comprising:
a base resin; and
microcapsules dispersed and disposed in the base resin, wherein:
each microcapsule comprises:
 a core part;
 a shell part wrapping the core part; and
 an organic solvent disposed in the core part;
an average diameter of the microcapsules is in a range from 50 nm to 500 nm; and
a transmittance in a wavelength range of 400 nm to 800 nm is greater than or equal to 90%.

2. The thermally releasable adhesive member of claim 1, wherein an absolute value of refractive index difference of the base resin and the microcapsule is less than or equal to 0.1.

3. The thermally releasable adhesive member of claim 1, wherein a haze value is less than or equal to 0.1%.

4. The thermally releasable adhesive member of claim 1, wherein a vaporization temperature of the organic solvent is in a range from about 90° C. to about 110° C.

5. The thermally releasable adhesive member of claim 4, wherein the organic solvent is leaked out from the microcapsule at a temperature higher than the vaporization temperature thereof.

6. The thermally releasable adhesive member of claim 4, wherein the thermally releasable adhesive member has a first adhesion strength at room temperature and a second adhesion strength at the vaporization temperature, and a relation of "second adhesion strength<0.9×(first adhesion strength)" is satisfied.

7. The thermally releasable adhesive member of claim 1, wherein the organic solvent has a solubility with respect to water that is less than or equal to 1.0 at room temperature.

8. The thermally releasable adhesive member of claim 1, wherein the organic solvent comprises at least one selected from methylcyclohexane, cyclohexane, cyclopentane, isooctane, tert-butyl acetate, heptene or heptane.

9. The thermally releasable adhesive member of claim 1, wherein an amount ratio of the microcapsules is in a range from 0.01 wt % to 20 wt % on the basis of a total weight of the base resin and the microcapsules.

10. The thermally releasable adhesive member of claim 1, wherein the thermally releasable adhesive member is a double-sided adhesive sheet comprising a first side and an opposite second side, and
a dispersion density of the microcapsules decreases from the first side to the second side.

11. The thermally releasable adhesive member of claim 1, wherein the thermally releasable adhesive member comprises:
a first adhesive part in which the microcapsules are dispersed with a first density;
a second adhesive part in which the microcapsules are dispersed with a second density; and
a third adhesive part disposed between the first adhesive part and the second adhesive part,
wherein:
the microcapsules in the third adhesive part are disposed with a third density; and
the third density is less than the first density or the second density.

12. The thermally releasable adhesive member of claim 1, wherein the base resin comprises at least one of an acryl-based resin, a silicone-based resin, an urethane-based resin, an epoxy-based resin, a rubber-based resin, or a polyester-based resin.

13. The thermally releasable adhesive member of claim 1, wherein the core part comprises at least one selected from poly(2-ethylhexylacrylate), polybutyl acrylate, polyvinyl acetate, polymethyl methacrylate, polyethyl acrylate, polymethyl acrylate, polybenzyl acrylate, polyphenoxyethyl acrylate, polyacrylic acid, polyhydroxyethyl methacrylate, polyglycidyl methacrylate, or polyacetoacetoxyethyl methacrylate.

14. The thermally releasable adhesive member of claim 1, wherein the shell part comprises at least one selected from polyethyleneamine, polyallylamine, polyvinylamine, polydimethylaminoethyl methacrylate, poly diallyldimethylammonium chloride, gelatin, bovine serum albumin, casein, or chitosan.

15. A thermally releasable adhesive member, comprising:
a base resin; and
microcapsules dispersed and disposed in the base resin, wherein:
each microcapsule comprises:
a core part;
a shell part wrapping the core part; and
an organic solvent disposed in the core part;
an average diameter of the microcapsules is in a range from 50 nm to 500 nm; and
the microcapsule is an amphiphilic particle in which the core part is hydrophobic and the shell part is hydrophilic.

16. A display apparatus comprising:
a display panel;
a window member disposed on the display panel; and
a thermally releasable adhesive member disposed between the display panel and the window member, wherein:
the thermally releasable adhesive member comprises a base resin and microcapsules dispersed and disposed in the base resin;
the microcapsule comprises:
a core part;
a shell part wrapping the core part; and
an organic solvent disposed in the core part;
an average diameter of the microcapsules is in a range from 50 nm to 500 nm; and
a transmittance in a wavelength range of 400 nm to 800 nm is greater than or equal to 90%.

17. The display apparatus of claim 16, wherein a vaporization temperature of the organic solvent is in a range from 90° C. to 110° C.

18. The display apparatus of claim 17,
the thermally releasable adhesive member comprises a first side adjacent to the window member; and
a second side opposite to the first side and adjacent to the display panel,
wherein at least one of the first side or the second side has a first adhesion strength at room temperature and at least one of the first side or the second side has a second adhesion strength at the vaporization temperature in the thermally releasable adhesive member, and
wherein a relation of "second adhesion strength<0.9×(first adhesion strength)" is satisfied.

19. The display apparatus of claim 16, further comprising an optically clear adhesive member which comprises the base resin but not comprises the microcapsule,
wherein the optically clear adhesive member is disposed between the display panel and the thermally releasable adhesive member, or between the window member and the thermally releasable adhesive member.

* * * * *